(12) United States Patent
Lee et al.

(10) Patent No.: US 7,879,740 B2
(45) Date of Patent: Feb. 1, 2011

(54) FERROCENE-CONTAINING CONDUCTIVE POLYMER, ORGANIC MEMORY DEVICE USING THE SAME AND FABRICATION METHOD OF THE ORGANIC MEMORY DEVICE

(75) Inventors: Kwang Hee Lee, Yongin-si (KR); Tae LIm Choi, Yongin-si (KR); Sang Kyun Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 497 days.

(21) Appl. No.: 11/790,757

(22) Filed: Apr. 27, 2007

(65) Prior Publication Data

US 2008/0111127 A1  May 15, 2008

(30) Foreign Application Priority Data

Nov. 13, 2006  (KR) .................... 10-2006-0111777

(51) Int. Cl.
*H01L 21/31* (2006.01)
*H01L 21/469* (2006.01)

(52) U.S. Cl. .............................. 438/780; 257/E21.007; 257/E51.027; 528/377; 556/14; 987/3

(58) Field of Classification Search .................. 257/643, 257/E21.007, E51.027; 438/780; 528/377; 556/14; 987/3
See application file for complete search history.

(56) References Cited

U.S. PATENT DOCUMENTS 5,272,238 A    12/1993  Garnier et al.
5,416,170 A    5/1995   Rhee et al.
6,944,047 B2   9/2005   Rotenberg et al.
7,307,338 B1*  12/2007  Mandell et al. ............. 257/643
2002/0163057 A1  11/2002  Bulovic et al.
2004/0027849 A1  2/2004   Yang et al.
2004/0227136 A1  11/2004  Lan et al.
2004/0250849 A1*  12/2004  Chen et al. ................... 136/263
2007/0197768 A1*  8/2007   Choi et al. ................... 528/395

FOREIGN PATENT DOCUMENTS

JP    62-095882    5/1987

OTHER PUBLICATIONS

Knapp et al., "Sythesis and material properties of soluble poly (1,1'-ferrocenylene-alt-p-oligophenylenes," Polymer, vol. 39, No. 23, pp. 5827-5838 (1998).
Lee et al., "Simple Synthetic Method of Preparing Conjugated Polymer Containing Ferrocene," Bull Korean Chem. Soc., vol. 21, No. 8, pp. 759-760 (2000).

* cited by examiner

*Primary Examiner*—Asok K Sarkar
(74) *Attorney, Agent, or Firm*—Harness, Dickey & Pierce, P.L.C.

(57) ABSTRACT

Disclosed are a ferrocene-containing conductive polymer, an organic memory device using the conductive polymer and a method for fabricating the organic memory device. The conductive polymer may include a fluorenyl repeating unit, a thienyl repeating unit and a diarylferrocenyl repeating unit. The organic memory device may possess the advantages of rapid switching time, decreased operating voltage, decreased fabrication costs and increased reliability. Based on these advantages, the organic memory device may be used as a highly integrated, large-capacity memory device.

22 Claims, 6 Drawing Sheets

US 7,879,740 B2

FERROCENE-CONTAINING CONDUCTIVE POLYMER, ORGANIC MEMORY DEVICE USING THE SAME AND FABRICATION METHOD OF THE ORGANIC MEMORY DEVICE

PRIORITY STATEMENT

This non-provisional application claims priority under 35 U.S.C. §119 to Korean Patent Application No. 10-2006-0111777, filed on Nov. 13, 2006, in the Korean Intellectual Property Office (KIPO), the entire contents of which are herein incorporated by reference.

BACKGROUND

1. Field

Example embodiments relate to a ferrocene-containing conductive polymer, an organic active layer including the conductive polymer, an organic memory device including the organic active layer and methods for fabricating the organic active layer and the organic memory device. Other example embodiments relate to a ferrocene-containing conductive polymer including a fluorenyl repeating unit, a thienyl repeating unit and a diarylferrocenyl repeating unit, an organic active layer including the conductive polymer, an organic memory device with improved operating characteristics and improved non-volatility fabricated using the organic active layer, and methods for fabricating the organic active layer and the organic memory device.

2. Description of the Related Art

With the recent dramatic developments in digital communication technology, demand for a variety of memory devices has been increasing rapidly. As the use of portable computers and electronic devices, including mobile terminals, smart cards, electronic money, digital cameras, personal digital assistants, digital audio players, multimedia players and others, has been extended in recent years, memory devices for use in these portable computers and electronic devices are required for retaining data in memory even when no power is being applied to the memory device, thereby tending to reduce the memory-related power consumption of the device.

Conventional memory devices may include a bistable element that may be switched between a higher resistance state and a lower resistance state when a voltage is applied to the devices. Resistive memory devices may be memories whose resistance is varied depending on an applied voltage and in which data may be stored in response to variations in the resistance.

Chalcogenide materials, semiconductors and various types of oxides and nitrides may be known to have resistive memory properties. Some organic materials may also be found to have resistive memory properties. Of these resistive memory devices, organic memory devices may include an upper electrode, a lower electrode and a memory layer between the upper and lower electrodes to utilize the bistability of resistance values obtained when a voltage is applied between the upper and lower electrodes for storing data. Such organic memory devices have attracted increasing attention as next-generation memories because they provide the desired non-volatility, which is an advantage associated with conventional flash memories, while also providing improved processability, reducing fabrication costs and/or improving the degree of integration.

One example of such an organic memory utilizes a 7,7,8,8-tetracyano-p-quinodimethane (CuTCNQ), which is an organometallic charge transfer complex compound, as the organic material. Another example includes semiconductor devices comprising an upper electrode, a lower electrode and an intermediate layer between the lower and upper electrodes, wherein the intermediate layer is formed from a mixture of an ionic salt, e.g., NaCl or CsCl, and a conductive polymer.

Other work has suggested organic memory devices comprising organic active layers and a metal nanocluster applied between the organic active layers, but efforts in this area have been hampered by relatively low yields, difficulties in forming suitable metal nanoclusters and reset voltages of about 0 V, rendering such devices generally unsuitable for widespread use as a nonvolatile organic memory.

Various materials have been investigated due to their potential use as materials for organic active layers of organic memory devices. One example of such an organic memory device may include an upper electrode, a lower electrode and a selectively conductive media between the two electrodes, wherein the selectively conductive media contains an organic layer and a passive layer and the organic layer may be comprised of a conjugated organic material.

Metallocenes and their derivatives are currently being investigated for their inherent electrical, optical and magnetic properties, for example, their ability to be oxidized to form mixed valent states. A major portion of research on metallocenes and their derivatives has been devoted to their use as fuel additives and polymerization catalysts. However, no study on the use of metallocenes and their derivatives as materials for active layers of organic memory devices has been reported.

SUMMARY

Example embodiments are provided below for addressing certain of the deficiencies and/or limitations of the related art memory devices through the manufacture and use of memory devices that incorporate a ferrocene-containing conductive polymer that may be used as a material for an organic active layer of an organic memory device to improve the operating characteristics of the organic memory device.

Example embodiments provide a highly integrated, large-capacity organic memory device comprising a ferrocene-containing conductive polymer that possesses the advantages of rapid switching time, decreased operating voltage, decreased fabrication costs and increased reliability.

Example embodiments of methods which may be used to fabricate such devices using less complicated and/or less expensive fabrication processes at a decreased temperature are also provided so that it may be applied to the manufacture of flexible memory devices.

In accordance with example embodiments, there is provided a ferrocene-containing conductive polymer represented by Formula 1:

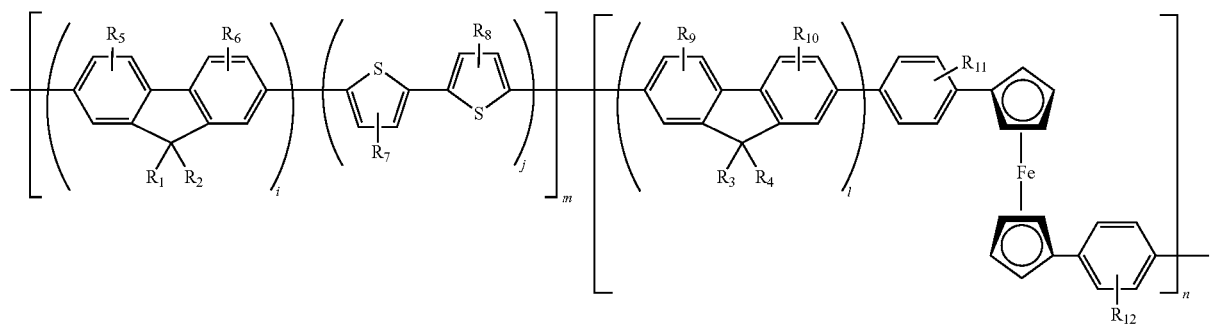

wherein $R_1$, $R_2$, $R_3$, $R_4$, $R_5$, $R_6$, $R_7$, $R_8$, $R_9$, $R_{10}$, $R_{11}$ and $R_{12}$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from about 0 to about 30, with the proviso that both i and j are not zero; l is an integer from about 1 to about 30; and m and n, which may be identical to or different from each other, are independently an integer from about 0 to about 200, with the proviso that both m and n are not zero.

The ferrocene-containing conductive polymer of Formula 1 may be a polymer represented by Formula 2:

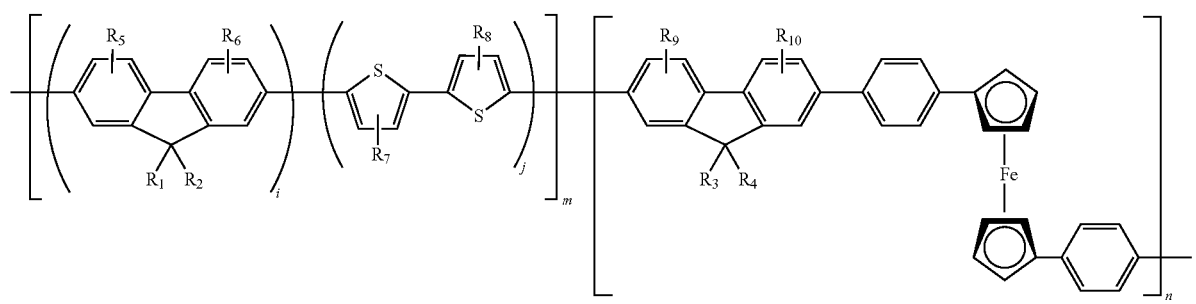

wherein $R_1$, $R_2$, $R_3$, $R_4$, $R_5$, $R_6$, $R_7$, $R_8$, $R_9$ and $R_{10}$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from about 0 to about 30, with the proviso that both i and j are not zero; and m and n, which may be identical to or different from each other, are independently an integer from about 0 to about 200, with the proviso that both m and n are not zero.

Ferrocene-containing conductive polymers that may be represented by Formula 1 include those of Formulas 3 and 4:

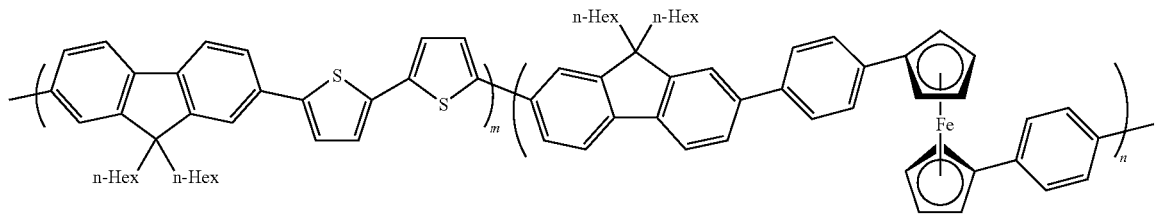

(3)

wherein m and n, which may be identical to or different from each other, are independently an integer from about 0 to about 200, with the proviso that both m and n are not zero; and

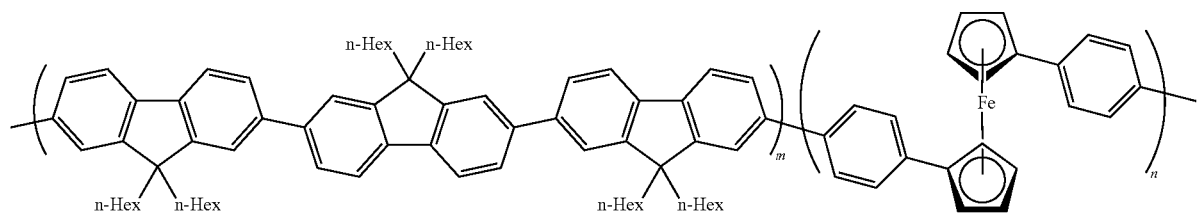

(4)

wherein m and n, which may be identical to or different from each other, are independently an integer from about 0 to about 200, with the proviso that both m and n are not zero.

Example embodiments include an organic active layer comprising the ferrocene-containing conductive polymer according to example embodiments.

Example embodiments also include organic memory devices comprising a first electrode, a second electrode and the organic active layer according to example embodiments between the first and second electrodes.

Example embodiments also include a method for fabricating an organic active layer that may include forming the organic active layer using a ferrocene-containing conductive polymer of Formula 1:

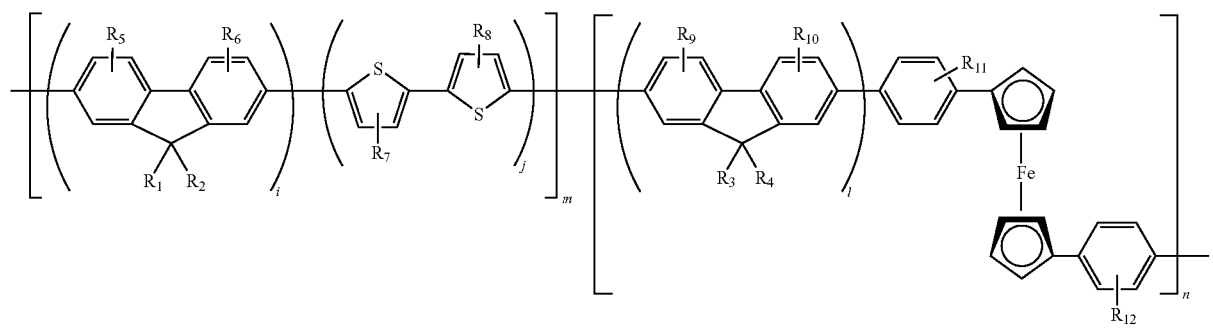

(1)

wherein $R_1$, $R_2$, $R_3$, $R_4$, $R_5$, $R_6$, $R_7$, $R_8$, $R_9$, $R_{10}$, $R_{11}$ and $R_{12}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; l is an integer from about 1 to about 30; and m and n, which is identical to or different from each other, are independently an integer from about 0 to about 200, with the proviso that both m and n are not zero.

Example embodiments of methods for fabricating organic memory devices may include forming a first electrode and a second electrode, and forming the organic active layer according to example embodiments between the first and second electrodes.

BRIEF DESCRIPTION OF THE DRAWINGS

Example embodiments will be more clearly understood from the following detailed description taken in conjunction with the accompanying drawings.

FIG. 1 is a schematic cross-sectional view of an organic memory device according to example embodiments;

FIG. 2 is a diagram illustrating the principle that memory properties of a ferrocene-containing conductive polymer according to example embodiments are realized depending on the oxidation state of the conductive polymer;

FIG. 3 is a schematic perspective view of a memory matrix employing a memory device according to example embodiments;

FIG. 4 is a $^1$H-NMR spectrum of a ferrocene-containing conductive polymer prepared in Preparative Example 1;

FIG. 5 is a $^1$H-NMR spectrum of a ferrocene-containing conductive polymer prepared in Preparative Example 2;

FIG. 6 is a graph showing variations in the current of an organic memory device fabricated in Example 1 in response to a voltage applied to the device; and FIG. 7 is a graph showing variations in two resistance values of an organic memory device fabricated in Example 1 as a function of time.

Figure 1:
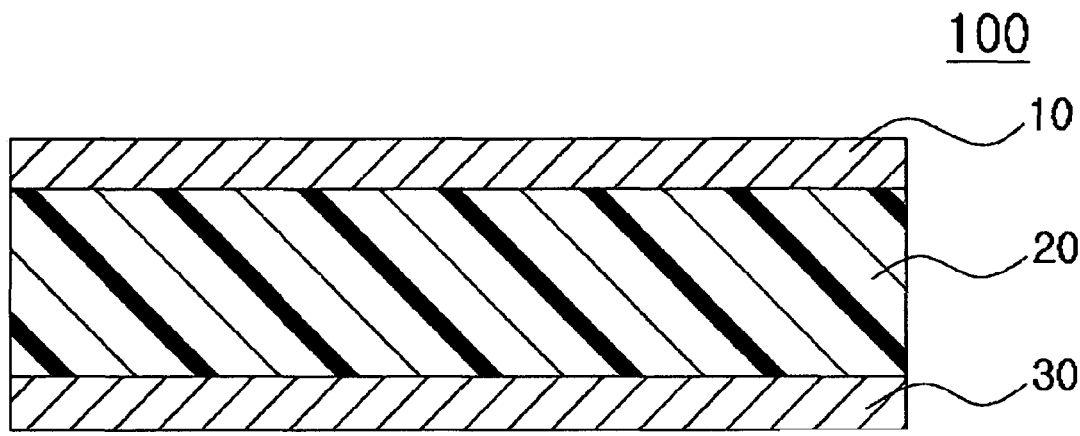
FIGS. 1-7 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings. In the drawings, the thicknesses and widths of layers are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Example embodiments are directed to a ferrocene-containing conductive polymer represented by Formula 1:

to $R_{12}$). The substituents $R_1$ to $R_{12}$ may be identical to or different from each other, and non-limiting examples thereof may include H, $C_1$-$C_{20}$ alkyl groups, $C_1$-$C_{20}$ alkoxy groups, $C_3$-$C_{20}$ cycloalkyl groups, $C_3$-$C_{20}$ heterocycloalkyl groups, $C_5$-$C_{30}$ aryl groups, $C_5$-$C_{30}$ heteroaryl groups, $C_7$-$C_{30}$ arylalkyl groups and $C_5$-$C_{30}$ aryloxy groups. The alkyl may be straight-chained or branched, and specific examples thereof may include methyl, ethyl, propyl, isobutyl, sec-butyl, tert-butyl, pentyl, iso-amyl and hexyl.

The term "cycloalkyl" as used herein refers to a $C_3$-$C_{20}$ monovalent monocyclic system. At least one hydrogen atom contained in the cycloalkyl group may be substituted.

The term "heterocycloalkyl" as used herein refers to a $C_3$-$C_{20}$ monovalent monocyclic system consisting of one to three heteroatoms selected from N, O, P and S atoms and the

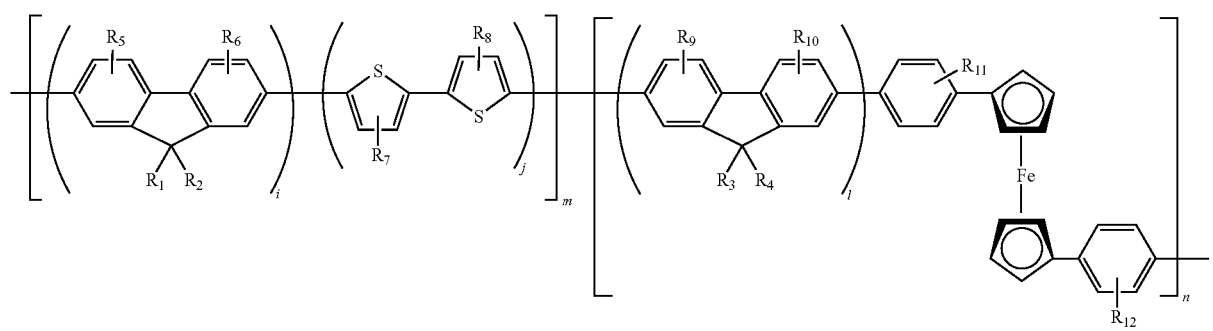

(1)

wherein $R_1$, $R_2$, $R_3$, $R_4$, $R_5$, $R_6$, $R_7$, $R_8$, $R_9$, $R_{10}$, $R_{11}$ and $R_{12}$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from about 0 to about 30, with the proviso that both i and j are not zero; l is an integer from about 1 to about 30; and m and n, which may be identical to or different from each other, are independently an integer from about 0 to about 200, with the proviso that both m and n are not zero.

The ferrocene-containing conductive polymer of example embodiments may include a fluorenyl repeating unit, a thienyl repeating unit and a diarylferrocenyl repeating unit. The diarylferrocenyl repeating unit of the ferrocene-containing conductive polymer according to example embodiments may be a moiety that utilizes its redox characteristics to achieve memory properties, the thienyl repeating unit may be a moiety with increased electron mobility, and the fluorenyl repeating unit may be a moiety that improves the quality of an organic active layer formed from the ferrocene-containing conductive polymer of Formula 1.

As represented by Formula 1, each of the aromatic rings of the repeating units may have one or more substituents (e.g. $R_1$ remaining ring carbon atoms. At least one hydrogen atom contained in the heterocycloalkyl group may be substituted.

The term "aryl" as used herein refers to a carbocyclic aromatic system including one or more aromatic rings in which the rings may be attached together in a pendent manner or may be fused. Specific examples of the aryl group may include aromatic groups, e.g., phenyl, naphthyl, and tetrahydronaphthyl. At least one hydrogen atom contained in the aryl group may be substituted.

The term "heteroaryl" as used herein refers to a $C_5$-$C_{30}$ cyclic aromatic system consisting of one to three heteroatoms selected from N, O, P and S atoms and the remaining ring carbon atoms in which the rings may be attached together in a pendant manner or may be fused. At least one hydrogen atom contained in the heteroaryl group may be substituted.

The term "arylalkyl" as used herein refers to a group in which a part of hydrogen atoms contained in the aryl group defined above are substituted with lower alkyl radicals, e.g., methyl, ethyl and propyl. Examples of the arylalkyl group may include benzyl and phenylethyl. At least one hydrogen atom contained in the arylalkyl group may be substituted.

The ferrocene-containing conductive polymer of Formula 1 may be a polymer represented by Formula 2:

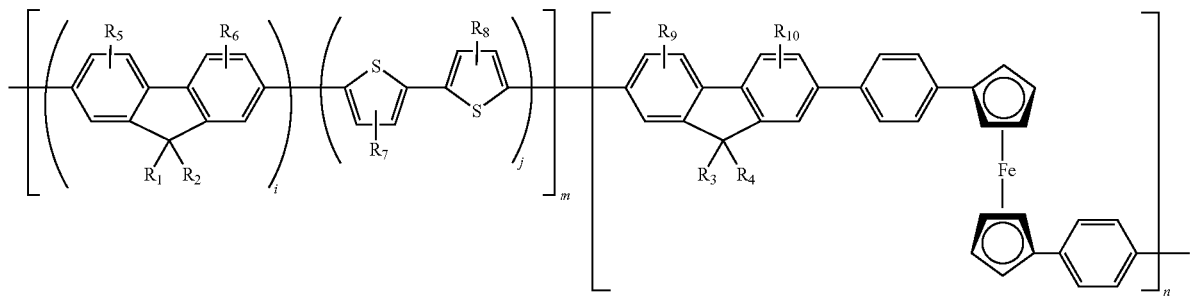

(2)

wherein $R_1$, $R_2$, $R_3$, $R_4$, $R_5$, $R_6$, $R_7$, $R_8$, $R_9$ and $R_{10}$ which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from 0 to 30, with the proviso that both i and j are not zero; and m and n, which may be identical to or different from each other, are independently an integer from about 0 to about 200, with the proviso that both m and n are not zero.

Ferrocene-containing conductive polymers that may be represented by Formula 1 may include those of Formulas 3 and 4:

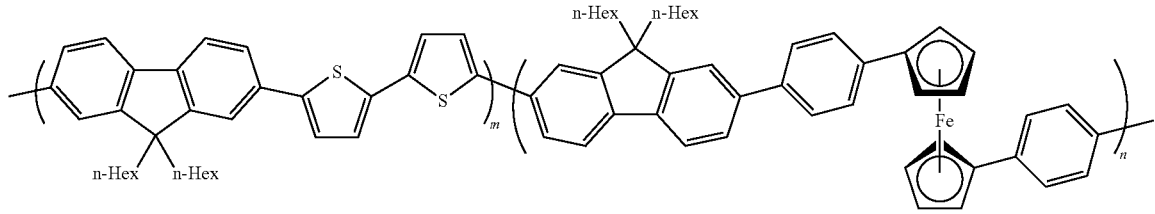

(3)

wherein m and n, which may be identical to or different from each other, are independently an integer from about 0 to about 200, with the proviso that both m and n are not zero; and

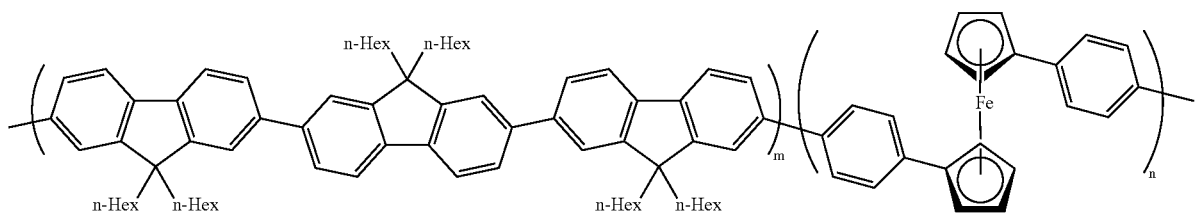

(4)

wherein m and n, which may be identical to or different from each other, are independently an integer from about 0 to about 200, with the proviso that both m and n are not zero.

The ferrocene-containing conductive polymer of example embodiments may be prepared by introducing at least one monomer corresponding to the diarylferrocenyl repeating unit, at least one monomer corresponding to the diarylferrocenyl repeating unit and at least one monomer corresponding to the fluorenyl repeating unit into a reactor, adding tetrakis(triphenylphosphine)palladium as a catalyst to the reactor, feeding a solvent and tetraethylammonium hydroxide as a base into the reactor, and reacting the mixture at about 110° C. This reaction is depicted in the following Reaction 1.

Reaction 1

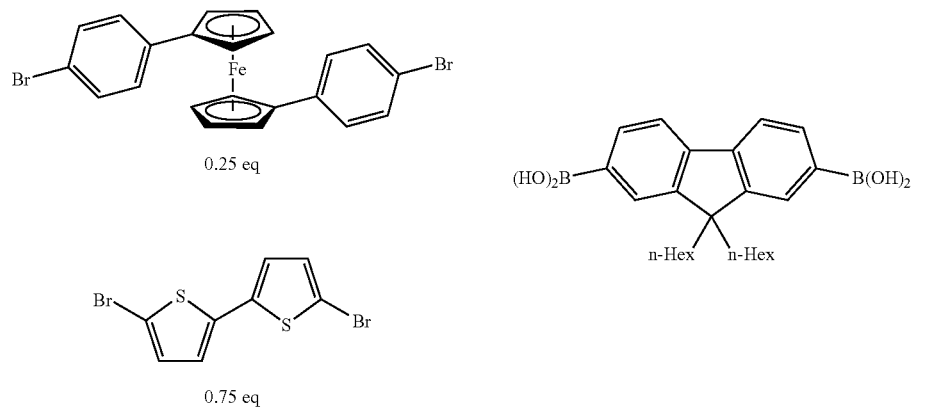

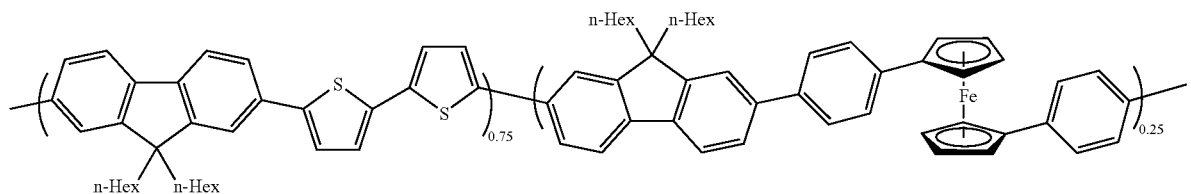

Specifically, the organoboronic acid may be reacted with the haloaryl compounds in the presence of a palladium catalyst by Suzuki coupling to induce a coupling reaction. A polymerization reaction may be effected due to the presence of the organoboronic acid groups and the halide groups at both ends of the organoboronic acid and the haloaryl compounds, respectively, to prepare the final polymer. The feeding of the monomers in one portion into the reactor may cause a random copolymerization of the monomers, and statistically random insertion of the ferrocene groups between the fluorene monomers. Several palladium-catalyzed reactions, for example, Stille reaction (coupling between a halide and an alkyl tin), Yamamoto reaction (reaction between halides) and Sonogashira reaction (coupling between a halide and an alkyne), may be employed in example embodiments other than Suzuki coupling.

Example embodiments are directed to an organic active layer comprising the ferrocene-containing conductive polymer of Formula 1:

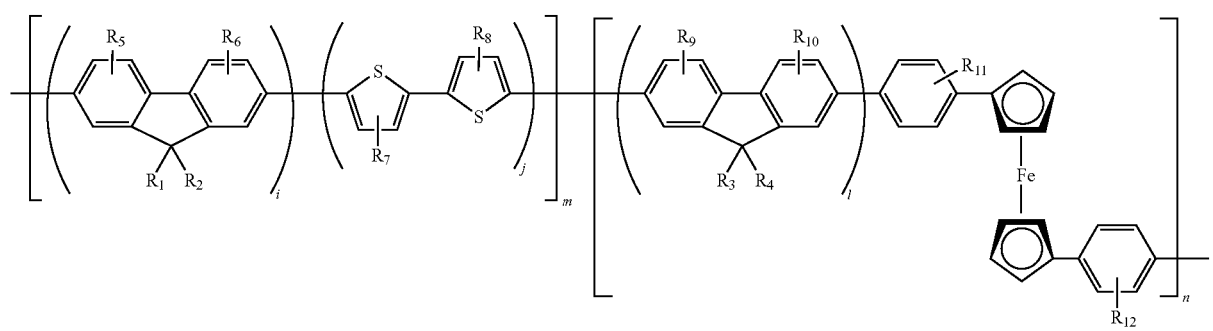

(1)

wherein $R_1$, $R_2$, $R_3$, $R_4$, $R_5$, $R_6$, $R_7$, $R_8$, $R_9$, $R_{10}$, $R_{11}$ and $R_{12}$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from about 0 to about 30, with the proviso that both i and j are not zero; l is an integer from about 1 to about 30; and m and n, which may be identical to or different from each other, are independently an integer from about 0 to about 200, with the proviso that both m and n are not zero.

The ferrocene-containing conductive polymer of Formula 1 may be the polymer of Formula 2 and/or may be the polymer of Formula 3 or 4.

Example embodiments are directed to an organic memory device comprising a first electrode, a second electrode and the organic active layer of example embodiments between the first and second electrodes.

FIG. 1 is a schematic cross-sectional view of an organic memory device according to example embodiments. With reference to FIG. 1, the organic memory device 100 of example embodiments may include a first electrode 10, a second electrode 30 and an organic active layer 20 between the first and second electrodes. The resistance values of the organic active layer 20 obtained when a voltage is applied to the memory device 100 exhibit bistability, e.g., the organic active layer can exhibit two distinct stable conductivity states at the same applied voltage, that may be utilized as the memory characteristics of the memory device.

Figure 2:
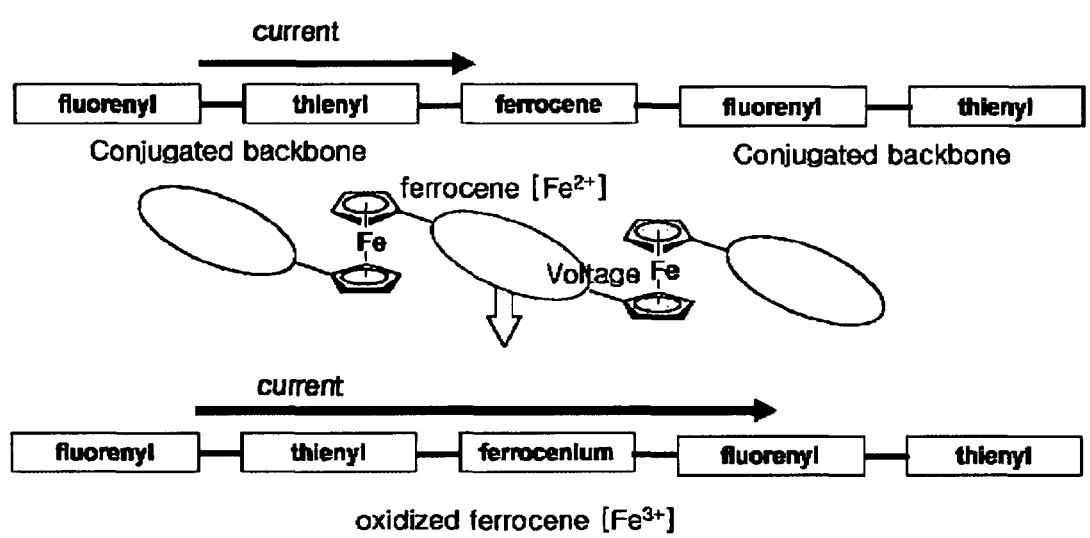

FIG. 2 is a diagram illustrating the principle that memory properties of the ferrocene-containing conductive polymer according to example embodiments are realized depending on the oxidation state of the conductive polymer. The organic active layer 20 of the organic memory device may provide increased conductivity and bistability. The ferrocene-containing conductive polymer of example embodiments may be a conjugated polymer and may have electron or hole conductivity due to its conjugated structure. The diarylferrocenyl repeating unit may permit the ferrocene-containing conductive polymer to have different multiple oxidation states, and may lose or gain one or more electrons to cause a variation in oxidation state when a voltage is applied to the organic memory device. The oxidation state of the organic active layer formed of the ferrocene-containing conductive polymer may be maintained unchanged until another voltage is applied to the organic active layer. The oxidation state of the organic active layer may be varied by various types of electrical techniques.

A ferrocene compound may be stable and may exhibit inherent conductivity when it is in the $Fe^{2+}$ state. A voltage greater than a threshold voltage or light energy having a particular wavelength may be applied to a ferrocene compound in the $Fe^{2+}$ state to excite the ferrocene compound to the oxidized state (e.g. $Fe^{3+}$ (ferrocenium)). The ferrocene compound in the oxidized state may exhibit improved charge transfer capacity and improved conductivity, compared to the ferrocene compound in the $Fe^{2+}$ state. Based on this phenomenon, the conductivity of the organic memory device may be varied due to a difference in the reactivity of the ferrocene-containing conductive polymer, and as a result, bistability of the organic active layer may be achieved. This bistable state may be maintained even when no power is being supplied to the organic memory device in order to ensure non-volatility of the organic memory device according to example embodiments.

When a proper electrical voltage is applied between the two electrodes of the memory device according to example embodiments, the organic active layer may switch between a higher resistance state and a lower resistance state. Assuming that the lower resistance state is defined as data "1" and the higher resistance state is defined as data "0", two logic states of the data may be stored. When the ferrocene-containing conductive polymer of example embodiments has two or more oxidation states, two or more logic states may be stored.

The organic active layer of the organic memory device according to example embodiments may be formed by combining the ferrocene-containing conductive polymer with at least one conductive polymer selected from polythiophene, polyvinylcarbazole, polyaniline, polypyrrole, polyphenylenevinylene, polyfluorene and polyacetylene. Specific examples of such conductive polymers may include poly(3-hexylthiophene-2,5-diyl), poly(9-vinylcarbazole), polyaniline(emeraldine base), poly[2-methoxy-5-(2-ethylhexyloxy)-1,4-phenylenevinylene], and poly(9,9-didodecylfluorenyl-2,7-yleneethynylene).

Figure 3:
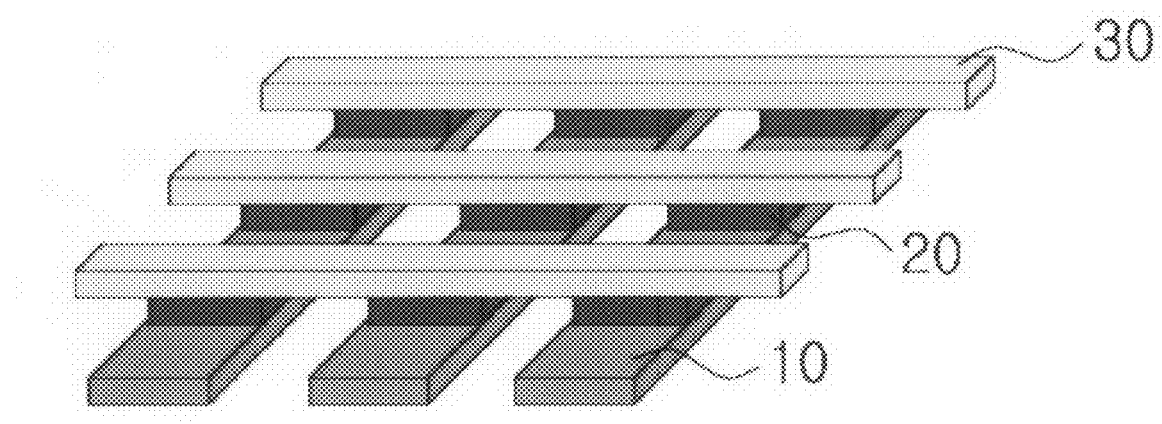

FIG. 3 is a schematic perspective view of an exemplary memory matrix employing the memory device of example embodiments. As shown in FIG. 3, the memory matrix may be formed on a suitable substrate, e.g., a glass or silicon substrate. With this configuration of the memory matrix, a plurality of memory cells may be formed at intersections between first electrodes 10 and second electrodes 30. The memory cells may provide bistability characteristics.

The organic memory device of example embodiments may be fabricated on a substrate. As the substrate, a common organic or inorganic substrate may be used, for example, a flexible substrate. Examples of suitable materials for the substrate may include, but may not be limited to, glass, silicon, surface-modified glass, polypropylene, activated acrylamide ceramics, membranes, gels and/or aerogels.

The first electrode 10 and the second electrode 30 may be made of at least one electrically conductive material selected from the group consisting of metals, metal alloys, metal nitrides, metal oxides, metal sulfides, conductive polymers, organic conductors, nanostructures, and crystals. Specific examples of materials for the first and second electrodes may include, but may not be limited to, gold (Au), silver (Ag), platinum (Pt), copper (Cu), cobalt, nickel, tin, titanium (Ti), tungsten (W), aluminum (Al), and indium tin oxide (ITO).

The organic memory device of example embodiments may further include a barrier layer under the first electrode or on the second electrode to prevent or reduce damage to the first or second electrode due to attacks by the organic materials. The barrier layer may be formed of a material selected from the group consisting of $SiO_x$, $AlO_x$, $NbO_x$, $TiO_x$, $CrO_x$, $VO_x$, $TaO_x$, $CuO_x$, $MgO_x$, $WO_x$ and $AlNO_x$, and may be formed of a material selected from the group consisting of $SiO_2$, $Al_2O_3$, $Cu_2O$, $TiO_2$ and $V_2O_3$. The barrier layer may also be formed of an organic material selected from LiF, Alq3, polymethylmethacrylate, polystyrene and PET, which may be widely used to form barrier layers of organic electroluminescence devices. The barrier layer may have a thickness of about 20 Å to about 300 Å.

The organic memory device of example embodiments may be well suited for use in electronic devices, e.g., computers, portable information devices, cell phones, medical devices, radar devices and/or satellite devices. Because the organic memory device of example embodiments may be reduced in size and weight, example embodiments may be used to improve the portability of portable digital devices, including cell phones, PDAs, notebook computers, digital cameras, portable multimedia players and/or DMB terminals.

Example embodiments are directed to a method for fabricating an organic active layer using a ferrocene-containing conductive polymer of Formula 1:

wherein $R_1$, $R_2$, $R_3$, $R_4$, $R_5$, $R_6$, $R_7$, $R_8$, $R_9$, $R_{10}$, $R_{11}$ and $R_{12}$, which may be identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which may be identical to or different from each other, are independently an integer from about 0 to about 30, with the proviso that both i and j are not zero; l is an integer from about 1 to about 30; and m and n, which may be identical to or different from each other, are independently an integer from about 0 to about 200, with the proviso that both m and n are not zero.

Example embodiments also provide an organic memory device fabricated by forming a first electrode and a second electrode, and forming an organic active layer between the first and second electrodes, wherein the organic active includes the ferrocene-containing conductive polymer of example embodiments. Materials for a substrate, the electrodes and the organic active layer are the same as those explained above.

The processes for coating the organic active layer using the ferrocene-containing conductive polymer may not be particularly limited, and may include, for example, spin coating, spray coating, electrostatic coating, dip coating, blade coating, roll coating and/or ink-jet printing. The thickness of the organic active layer will vary depending on the material, the intended use and the desired operating characteristics, but it is anticipated that organic active layers having a thickness of about 50 Å to about 3,000 Å may be suitable for most applications.

Any solvent that may dissolve the ferrocene-containing conductive polymer may be used for spin coating. At least one solvent selected from the group consisting of chloroform, N-methylpyrrolidone, acetone, cyclopentanone, cyclohexanone, methyl ethyl ketone, ethyl cellosolve acetate, butylacetate, ethylene glycol, toluene, xylene, tetrahydrofuran, dimethylformamide, chlorobenzene, acetonitrile and mixtures thereof may be used to form the organic active layer by spin coating. A solvent system or solvent mixture of two or more of these solvents in any miscible ratio may also be used.

Baking may be performed after the coating. Baking processes may be suitably selected according to the solvent used. Taking into consideration the boiling point of the coating solvent used, the baking may be performed on a hot plate for about 10 minutes or more. The first and second electrodes may be made by known deposition, formation and/or coating processes, including deposition (e.g., thermal evaporation), sputtering, e-beam evaporation and spin coating.

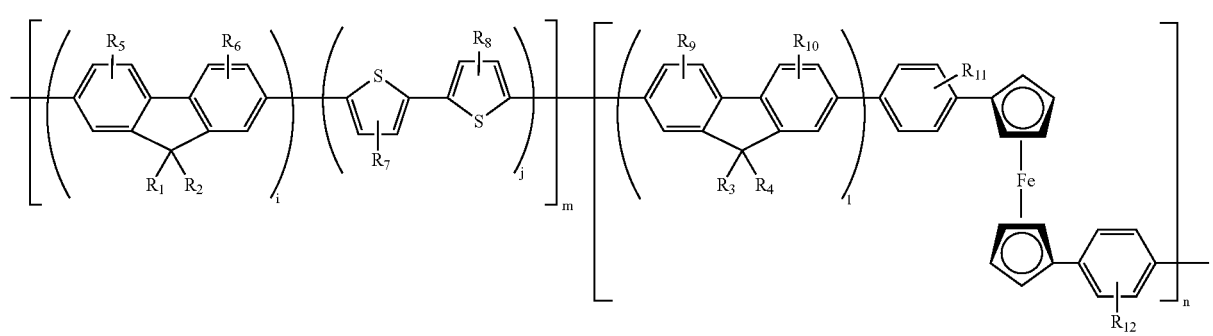

(1)

Hereinafter, example embodiments will be explained in more detail with reference to the following examples. However, these examples are given for the purpose of illustration and are not to be construed as limiting the scope of example embodiments.

Preparative Example 1

The ferrocene-containing conductive polymer of Formula 3 was synthesized by the following Reaction 1.

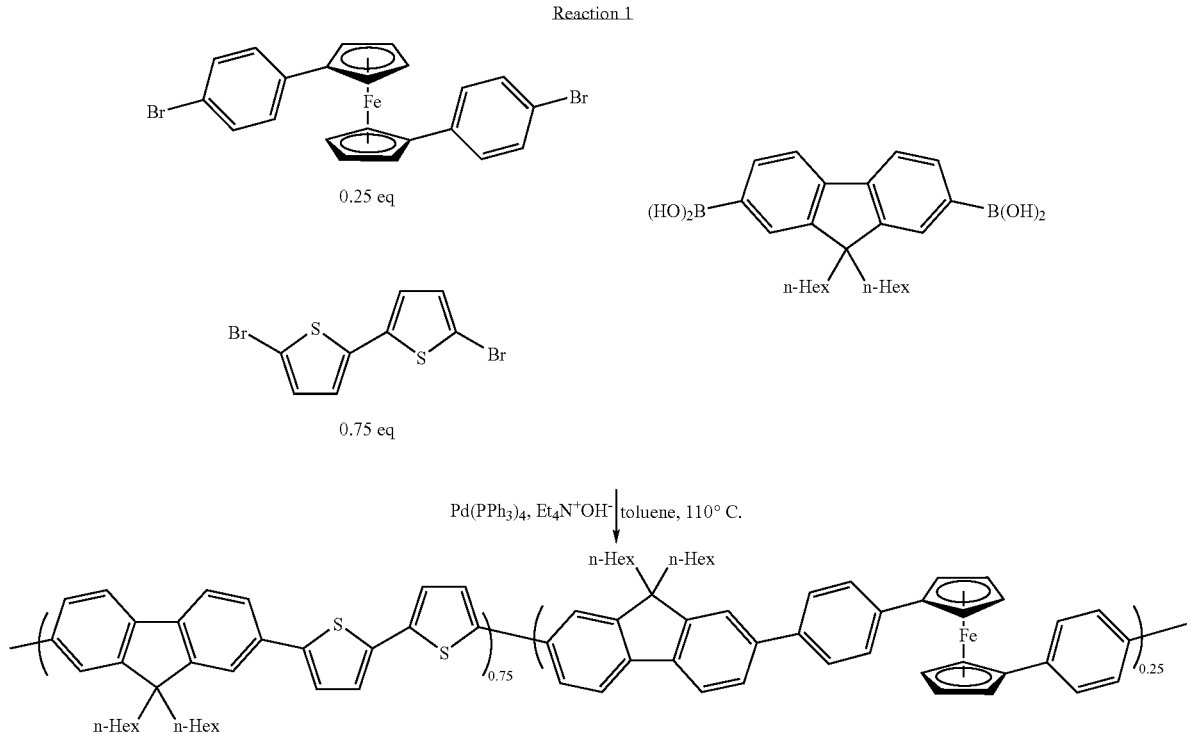

Figure 4:
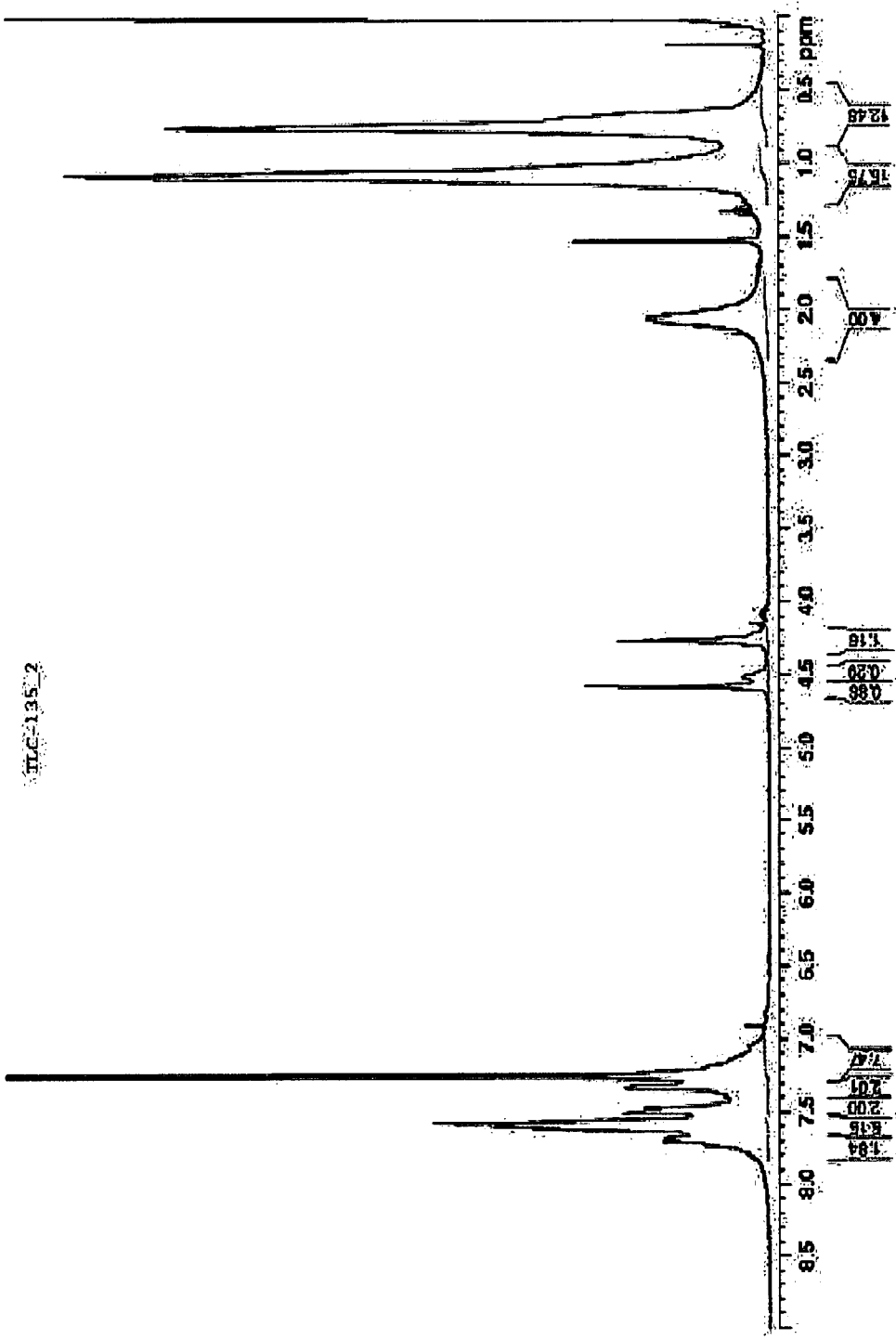

About 74 mg (about 0.15 mmol) of 1,1'-bis(p-bromophenyl)ferrocene, about 146 mg (about 0.45 mmol) of 5,5'-dibromo-2,2-bithiophene, about 253 mg (about 0.6 mmol) of 9,9-di(2'-ethylhexyl)fluorene-2,7-diboronic acid and about 14 mg (about 2 mol %) of tetrakis(triphenylphosphine)palladium were placed in a flask. After a reflux condenser was connected to the flask, about 1 ml of toluene as a solvent and about 3 ml of tetraethylammonium hydroxide (about 1.33 M) were injected into the flask using a syringe under a nitrogen atmosphere. The solution was degassed with nitrogen gas, and refluxed in an oil bath. The reaction was allowed to proceed for about 4 days. The reaction solution was diluted with about 20 ml of methylene chloride and neutralized with a saturated aqueous solution of ammonium chloride. The neutralized solution was transferred to a separatory funnel, followed by phase separation. The obtained organic layer was dried over anhydrous magnesium sulfate and passed through a glass filter to obtain a transparent polymer solution. The polymer solution was evaporated under reduced pressure to remove the solvents. The concentrated polymer solution was slowly added to aggressively stirring methanol to obtain a precipitate as an orange solid. The precipitate was filtered and washed with methanol several times, yielding the ferrocene-containing polymer (about 288 mg) of Formula 3 as a solid. The $^1$H-NMR spectrum of the ferrocene-containing polymer is shown in FIG. 4.

Preparative Example 2

Figure 5:
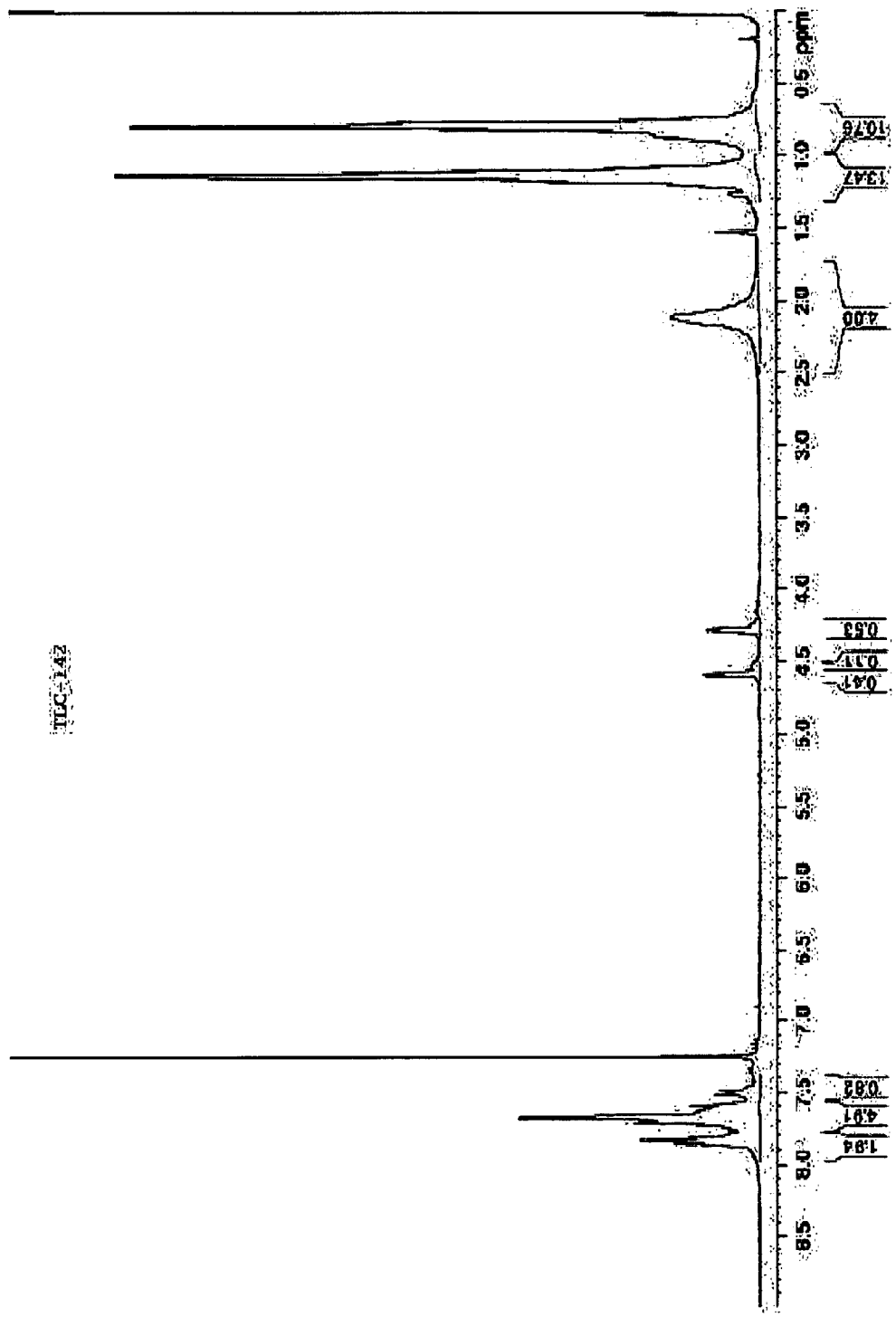

The ferrocene-containing conductive polymer (about 303 mg) of Formula 4 as an orange solid was prepared in the same manner as in Preparative Example 1, except that about 62 mg (about 0.125 mmol) of 1,1'-bis(p-bromophenyl)ferrocene, about 185 mg (about 0.375 mol) of 9,9-dihexyl-2,7-dibromofluorene, about 211 mg (about 0.5 mmol) of 9,9-di(2'-ethylhexyl)fluorene-2,7-diboronic acid and about 12 mg (about 2 mol %) of tetrakis(triphenylphosphine)palladium were reacted in a flask. The $^1$H-NMR spectrum of the ferrocene-containing conductive polymer is shown in FIG. 5.

Example 1

An ITO-deposited glass substrate (Corning™ 1737) was purchased, cut to a size about 5 cm×about 5 cm, and patterned by photolithography/wet etching. The patterned substrate was dipped in acetone/isopropyl alcohol, ultrasonicated for about 15 minutes, and dried. About 10 mg of the ferrocene-containing polymer prepared in Preparative Example 1 was dissolved in about 1 ml of chlorobenzene ($C_6H_5Cl$) by sonication for about 30 minutes. The solution was passed through a syringe filter (pore size: about 0.2 μm) made of PTFE, and spin-coated at about 2,000 rpm on the ITO/glass substrate for about 30 seconds. The remaining solvent was removed by baking the coated substrate on a hot plate at about 110° C. for about 10 minutes to form an organic active layer. The organic active layer thus formed had a thickness of about 50 nm to about 100 nm, as measured using an Alpha-Step™ profilometer. A shadow mask was placed on the resulting substrate and introduced into a thermal evaporator. LiF was deposited to a thickness of about 5 nm on the organic active layer to form a barrier layer, and thereafter, Al was deposited to a thickness of about 80 nm on the barrier layer by thermal evaporation to form an upper electrode, completing fabrication of an organic memory device according to example embodiments. The thicknesses of the electrodes were controlled using a quartz crystal monitor.

Test Example 1

Test for Switching Characteristics of Memory Device

Figure 6:
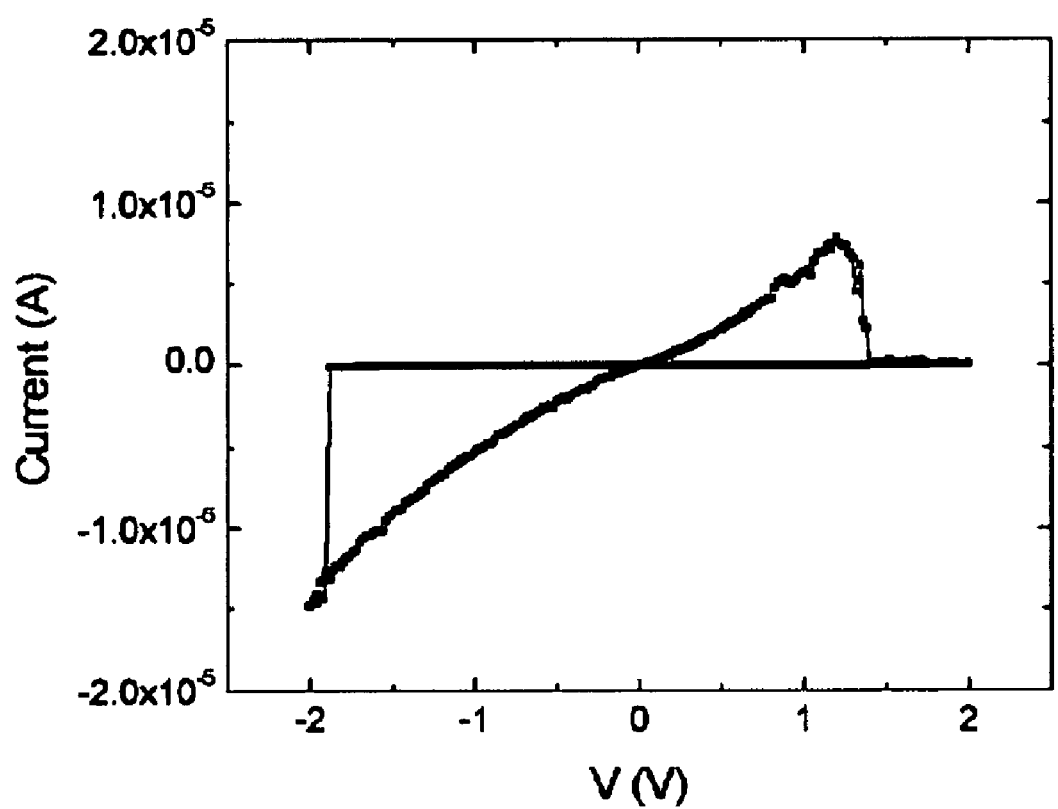

The electrical properties of the memory device fabricated in Example 1 were evaluated using a Keithley S4200 semiconductor characterization system. After a voltage was applied to the memory device, the switching properties of the memory device were evaluated as variations in current and the obtained results are shown in FIG. 6. Variations in two resistance values of the organic memory device were measured as a function of time, and the results are shown in FIG. 7.

Referring to FIG. 6, the memory device showed two conducting states when a maximum voltage of about 2 V was swept in both positive (+) and negative (−) directions. Where sweeping was carried out by the application of a positive voltage, the memory device became a higher resistance state (e.g. an "OFF" state) at about 1.4 V. Where a negative bias voltage was applied, the memory device switched into a decreased resistance state (e.g. an "ON" state) at about −1.8 V. When a voltage was continuously applied in the sweep mode of both directions, the memory device was continuously switched with a variation in switching voltage of about 0.3 V.

Figure 7:
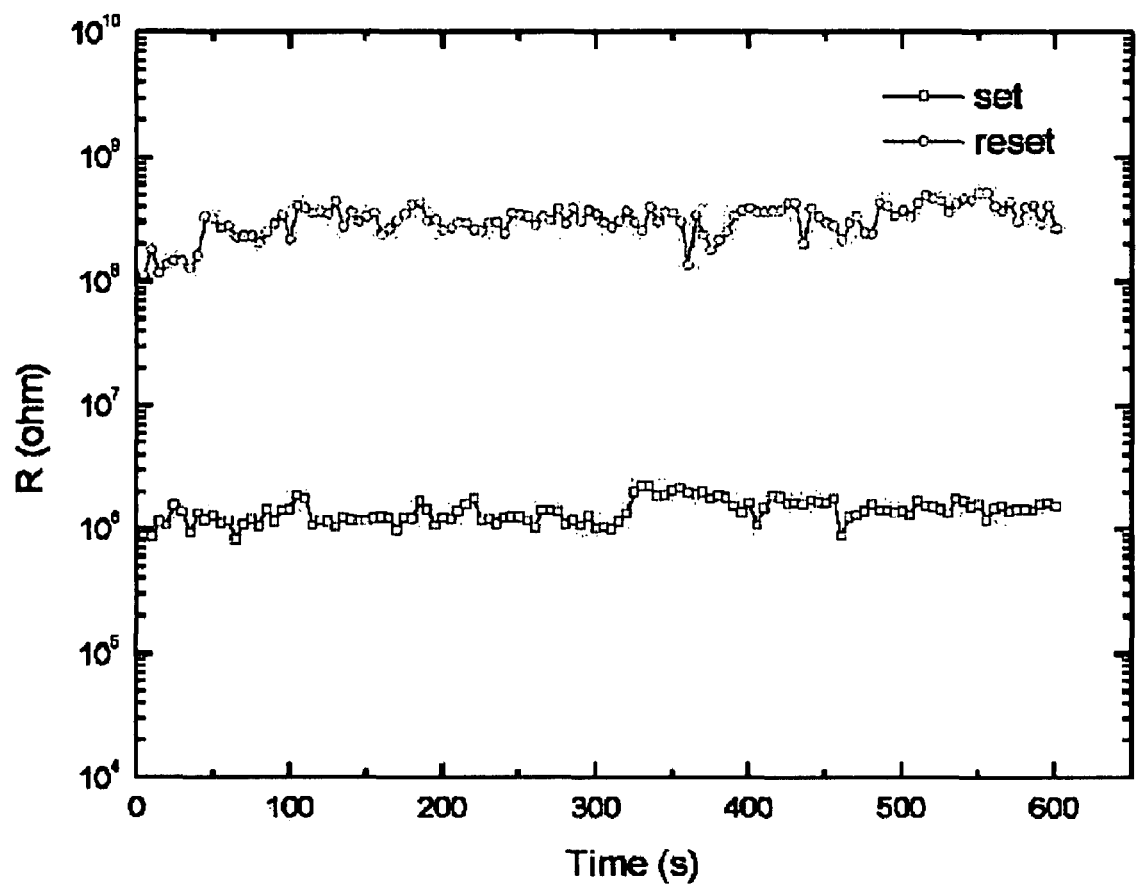

As evident from the graph of FIG. 7, each of the two different resistance states could be maintained for a relatively long period of time even when no voltage or current was applied to the memory device. To ascertain this, the resistance values of the memory device were measured when a much lower voltage (about 0.2 V) than a threshold voltage was applied to the device at an interval of about 10 seconds for about 10 minutes. As a result, the two resistance states were stably maintained.

As apparent from the above description, the organic memory device of example embodiments may offer the advantages of possible miniaturization, rapid switching time, decreased operating voltage, decreased fabrication costs and increased reliability over inorganic memory devices. Based on these advantages, the organic memory device of example embodiments may be used as a light-weight, highly integrated, large-capacity memory device.

In addition, because the organic memory device of example embodiments may be fabricated by a simple and economical process, e.g., spin coating, and may be processed at a decreased temperature, example embodiments may be applied to a flexible memory device.

Furthermore, the organic memory device fabricated using the ferrocene-containing polymer of example embodiments may achieve improved nonvolatile memory characteristics, compared to organic memory devices fabricated using conventional conductive polymers.

Although example embodiments have been disclosed for illustrative purposes, those skilled in the art will appreciate that various modifications and variations are possible, without departing from the scope and spirit of the appended claims. Accordingly, such modifications and variations are intended to come within the scope of the claims.

What is claimed is:

1. A ferrocene-containing conductive polymer represented by Formula 1:

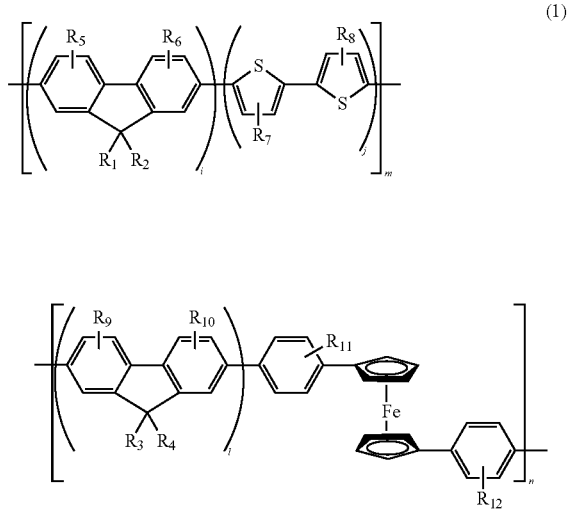

(1)

wherein $R_1$, $R_2$, $R_3$, $R_4$, $R_5$, $R_6$, $R_7$, $R_8$, $R_9$, $R_{10}$, $R_{11}$ and $R_{12}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; l is an integer from about 1 to about 30; and m and n, which are identical to or different from each other, are independently an integer from about 1 to about 200.

2. The ferrocene-containing conductive polymer according to claim 1, wherein the conductive polymer is a polymer represented by Formula 2:

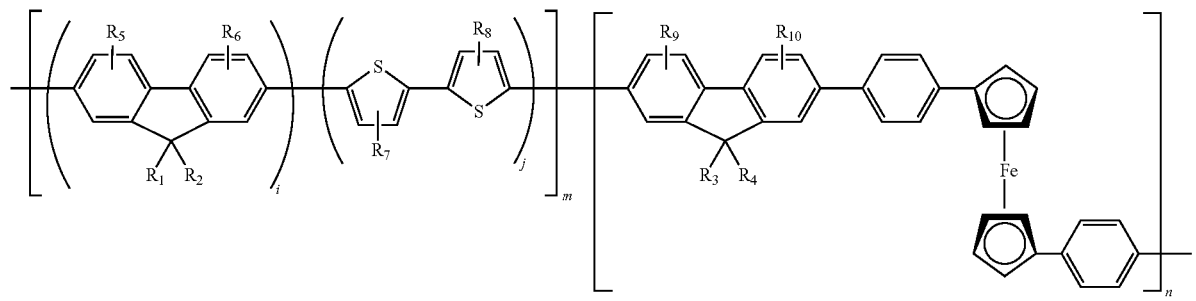

(2)

wherein $R_1$, $R_2$, $R_3$, $R_4$, $R_5$, $R_6$, $R_7$, $R_8$, $R_9$ and $R_{10}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; and m and n, which are identical to or different from each other, are independently an integer from about 1 to about 200.

3. The ferrocene-containing conductive polymer according to claim 2, wherein the conductive polymer is represented by Formula 3 or 4:

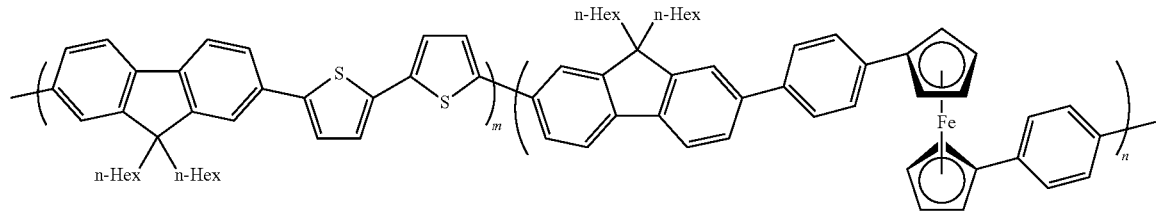

(3)

wherein m and n, which are identical to or different from each other, are independently an integer from about 1 to about 200;

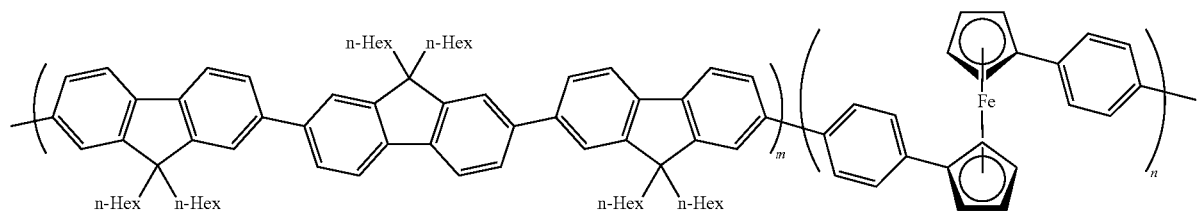

(4)

wherein m and n, which are identical to or different from each other, are independently an integer from about 1 to about 200.

4. An organic active layer comprising the ferrocene-containing conductive polymer according to claim 1.

5. An organic memory device comprising a first electrode, a Second electrode and the organic active layer according to claim 4 between the first and second electrodes.

6. The organic memory device according to claim 5, wherein the first or second electrode is made of at least one material selected from the group consisting of metals, metal alloys, metal nitrides, metal oxides, metal sulfides, organic conductors, nanostructures, and crystals.

7. The organic memory device according to claim 6, wherein the first or second electrode is made of at least one material selected from the group consisting of gold (Au), silver (Ag), platinum (Pt), copper (Cu), cobalt, nickel, tin, titanium (Ti), tungsten (W), aluminum (Al), and indium tin oxide (ITO).

8. The organic memory device according to claim 5, further comprising:
a barrier layer under the first electrode or on the second electrode.

9. The organic memory device according to claim 8, wherein the barrier layer is made of an organic material selected from the group consisting of LiF, $SiO_x$, $AlO_x$, $NbO_x$, $TiO_x$, $CrO_x$, $VO_x$, $TaO_x$, $CuO_x$, $MgO_x$, $WO_x$ and $AlNO_x$, or an organic material selected from the group consisting of Alq3, polymethylmethacrylate, polystyrene and PET.

10. The organic memory device according to claim 9, wherein the barrier layer is made of a material selected from the group consisting of $SiO_2$, $Al_2O_3$, $Cu_2O$, $TiO_2$, and $V_2O_3$.

11. The organic active layer according to claim 4, wherein the ferrocene-containing conductive polymer is a polymer represented by Formula 2:

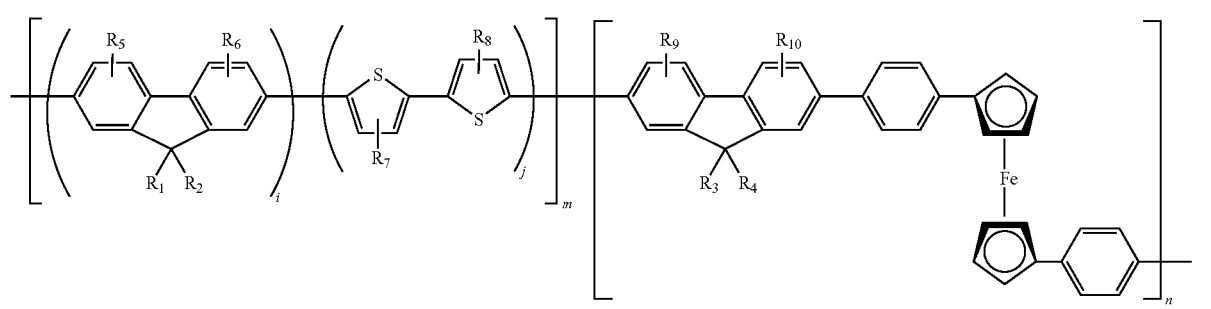

(2)

wherein $R_1$, $R_2$, $R_3$, $R_4$, $R_5$, $R_6$, $R_7$, $R_8$, $R_9$ and $R_{10}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; and m and n, which are identical to or different from each other, are independently an integer from about 1 to about 200.

12. The organic active layer according to claim 11, wherein the ferrocene-containing conductive polymer is represented by Formula 3 or 4:

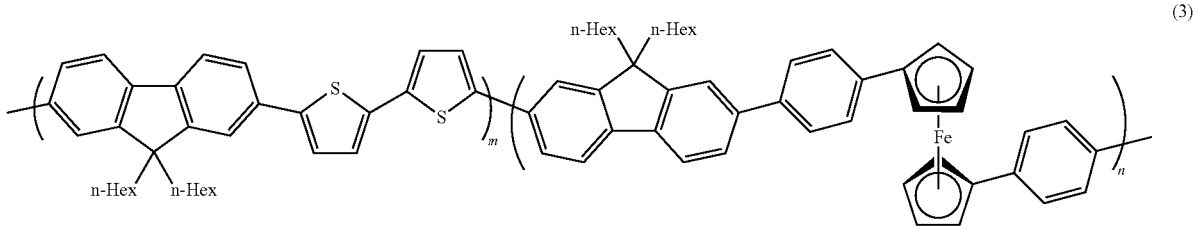

(3)

wherein m and n, which are identical to or different from each other, are independently an integer from about 1 to about 200; or

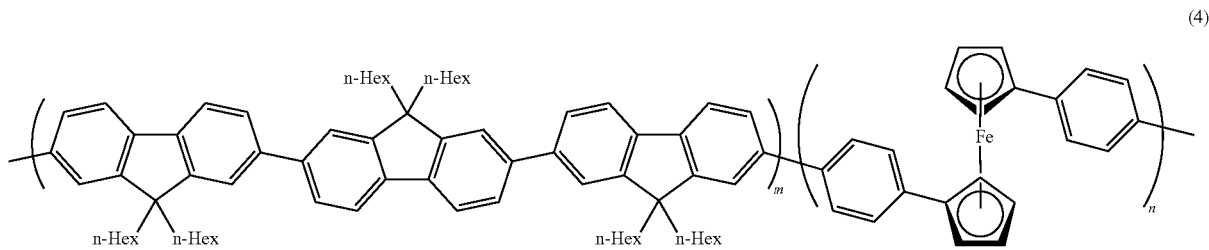

(4)

wherein m and n, which are identical to or different from each other, are independently an integer from about 1 to about 200.

13. A method for fabricating an organic active layer comprising:

forming the organic active layer using a ferrocene-containing conductive polymer of Formula 1:

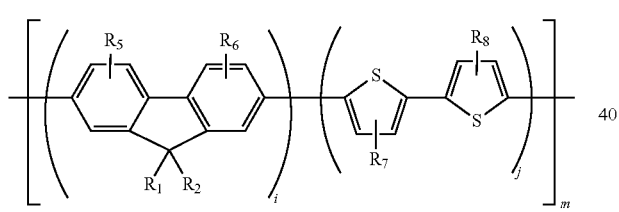

(1)

-continued

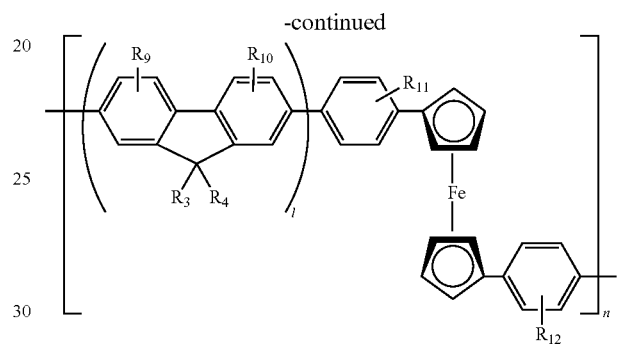

wherein $R_1$, $R_2$, $R_3$, $R_4$, $R_5$, $R_6$, $R_7$, $R_8$, $R_9$, $R_{10}$, $R_{11}$ and $R_{12}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; l is an integer from about 1 to about 30; and m and n, which are identical to or different from each other, are independently an integer from about 1 to about 200.

14. The method according to claim 13, wherein the conductive polymer is a polymer represented by Formula 2:

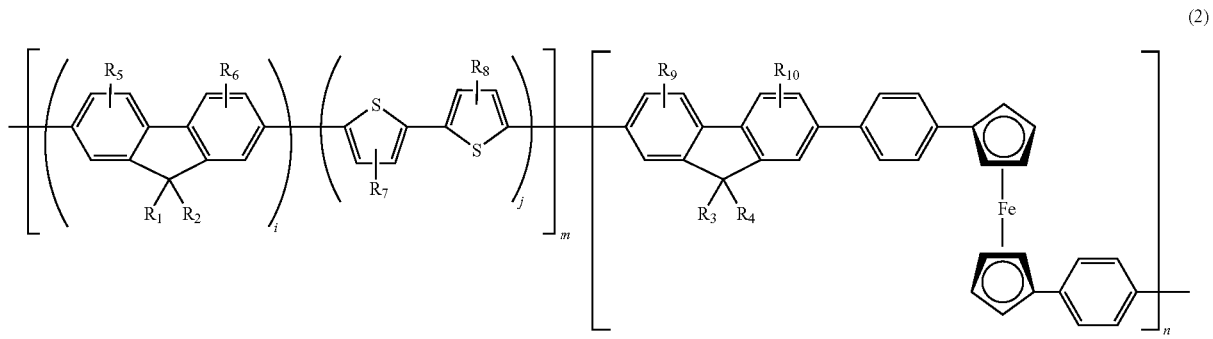

(2)

wherein $R_1$, $R_2$, $R_3$, $R_4$, $R_5$, $R_6$, $R_7$, $R_8$, $R_9$ and $R_{10}$, which is identical to or different from each other, are independently H, a $C_1$-$C_{20}$ alkyl group, a $C_1$-$C_{20}$ alkoxy group, a $C_3$-$C_{20}$ cycloalkyl group, a $C_3$-$C_{20}$ heterocycloalkyl group, a $C_5$-$C_{30}$ aryl group, a $C_5$-$C_{30}$ heteroaryl group, a $C_7$-$C_{30}$ arylalkyl group or a $C_5$-$C_{30}$ aryloxy group; i and j, which is identical to or different from each other, are independently an integer from about 0 to about 30, with the proviso that both i and j are not zero; and m and n, which are identical to or different from each other, are independently an integer from about 1 to about 200.

15. The method according to claim 14, wherein the conductive polymer is represented by Formula 3 or 4:

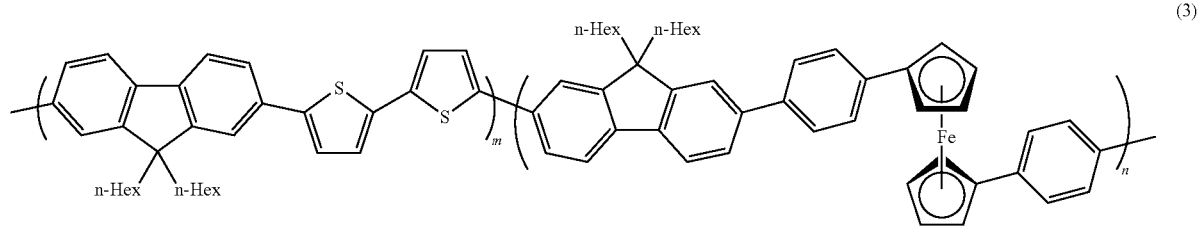

(3)

wherein m and n, which are identical to or different from each other, are independently an integer from about 1 to about 200; or

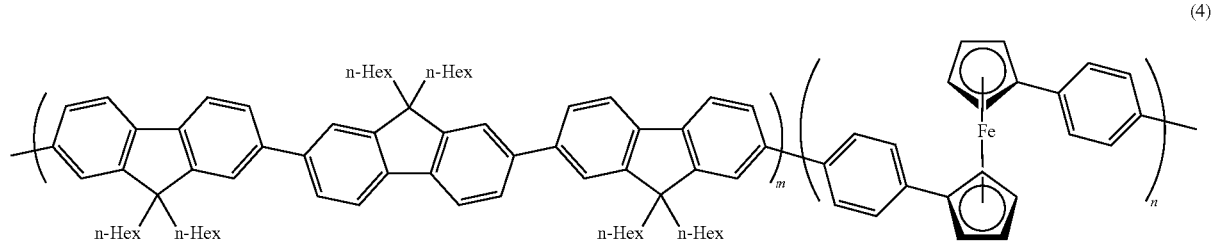

(4)

wherein m and n, which are identical to or different from each other, are independently an integer from about 1 to about 200.

16. The method according to claim 13, wherein the organic active layer is formed by coating the ferrocene-containing conductive polymer by a process selected from the group consisting of spin coating, spray coating, electrostatic coating, dip coating, blade coating, and roll coating.

17. The method according to claim 13, wherein the ferrocene-containing conductive polymer is coated using at least one solvent selected from the group consisting of chloroform, N-methylpyrrolidone, acetone, cyclopentanone, cyclohexanone, methyl ethyl ketone, ethyl cellosolve acetate, butyl acetate, ethylene glycol, toluene, xylene, tetrahydrofuran, dimethylformamide, chlorobenzene, and acetonitrile.

18. A method of fabricating an organic memory device comprising:
   forming a first electrode and a second electrode; and
   forming the organic active layer according to claim 13 between the first and second electrodes.

19. The method according to claim 18, wherein the first or Second electrode is made of at least one material selected from the group consisting of metals, metal alloys, metal nitrides, metal oxides, metal sulfides, organic conductors, nanostructures, and crystals.

20. The method according to claim 18, further comprising:
   forming a barrier layer under the first electrode or on the second electrode.

21. The method according to claim 20, wherein the barrier layer is formed of an organic material selected from the group consisting of LiF, $SiO_x$, $AlO_x$, $NbO_x$, $TiO_x$, $CrO_x$, $VO_x$, $TaO_x$, $CuO_x$, $MgO_x$, $WO_x$ and $AlNO_x$, or an organic material selected from the group consisting of Alq3, polymethylmethacrylate, polystyrene and PET.

22. The method according to claim 21, wherein the barrier layer is formed of a material selected from the group consisting of $SiO_2$, $Al_2O_3$, $Cu_2O$, $TiO_2$, and $V_2O_3$.

* * * * *